United States Patent [19]

Selyutin et al.

[11] Patent Number: 5,951,776
[45] Date of Patent: Sep. 14, 1999

[54] SELF ALIGNING LIFT MECHANISM

[75] Inventors: Leonid Selyutin, San Leandro; Jun Zhao, Milpitas, both of Calif.

[73] Assignee: Applied Materials, Inc., Santa Clara, Calif.

[21] Appl. No.: 08/738,240

[22] Filed: Oct. 25, 1996

[51] Int. Cl.[6] .............................. C23C 16/00; B66B 9/02; B65G 29/00; B65G 47/00
[52] U.S. Cl. .......................... 118/729; 187/267; 187/268; 198/468.8; 198/617
[58] Field of Search ..................................... 118/728, 729; 187/267, 268; 198/468.8, 617, 657, 672, 674, 663

[56] References Cited

U.S. PATENT DOCUMENTS

| | | | |
|---|---|---|---|
| 3,831,460 | 8/1974 | Linley | 74/459 |
| 3,977,269 | 8/1976 | Linley | 74/441 |
| 4,434,677 | 3/1984 | Linley | 74/409 |
| 4,687,542 | 8/1987 | Davis et al. | 156/643 |
| 4,781,511 | 11/1988 | Harada et al. | 414/217 |
| 4,909,185 | 3/1990 | Aldridge et al. | 118/729 |
| 5,055,036 | 10/1991 | Asano et al. | 432/5 |
| 5,097,794 | 3/1992 | Mahler et al. | 118/719 |
| 5,133,285 | 7/1992 | Mahler et al. | 118/719 |
| 5,354,382 | 10/1994 | Sung et al. | 118/723 MR |
| 5,421,894 | 6/1995 | Lie et al. | 118/725 |
| 5,458,688 | 10/1995 | Watanabe | 118/724 |
| 5,556,476 | 9/1996 | Lei et al. | 118/728 |
| 5,558,717 | 9/1996 | Zhao et al. | 118/715 |
| 5,695,568 | 12/1997 | Sinha et al. | 118/729 |
| 5,772,773 | 6/1998 | Wytman | 118/729 |

FOREIGN PATENT DOCUMENTS 438824  10/1992  Japan ........................... H01L 21/205

*Primary Examiner*—Bruce Breneman
*Assistant Examiner*—Jeffrie R Lund
*Attorney, Agent, or Firm*—Peters, Verny, Jones & Biksa

[57] ABSTRACT

A particular configuration of a compact self-aligning lift mechanism is provided for lifting the stem of a pedestal in a processing chamber while minimizing process anomalies due to geometric misalignment and binding of moving pieces. The force associated with supporting a stem in a processing chamber is routed through a first arm through a base portion of a carrier bracket where it engages a linear bearing such that the truck and track of the linear bearing absorb all forces riot aligned with the bearing. A second arm extending from the base portion, for example through a set of slots adjacent to the bearing track support member, is attached to a lift mechanism which can oppose the force from the pedestal stem such that the displacements of the first and second arms are predictable based on the force on that arm. A compliant nut is used so that the drive screw can be somewhat misaligned with the linear bearing track without causing binding, misalignment, or non-repeatability of substrate positioning during processing.

34 Claims, 9 Drawing Sheets

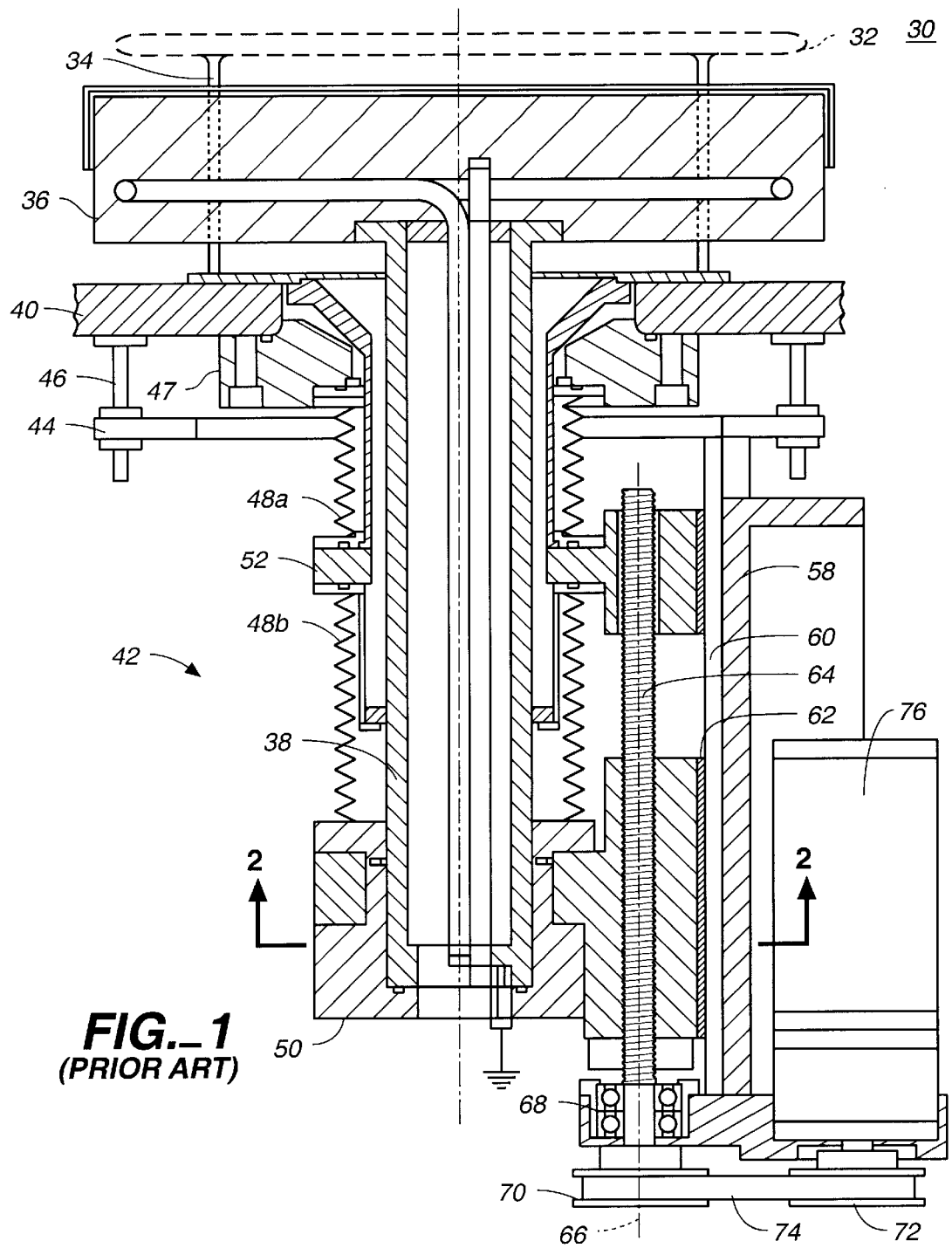
FIG._1
(PRIOR ART)
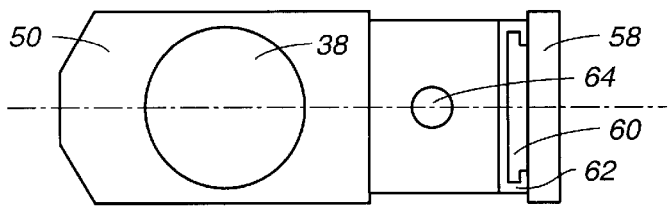
FIG._2
(PRIOR ART)

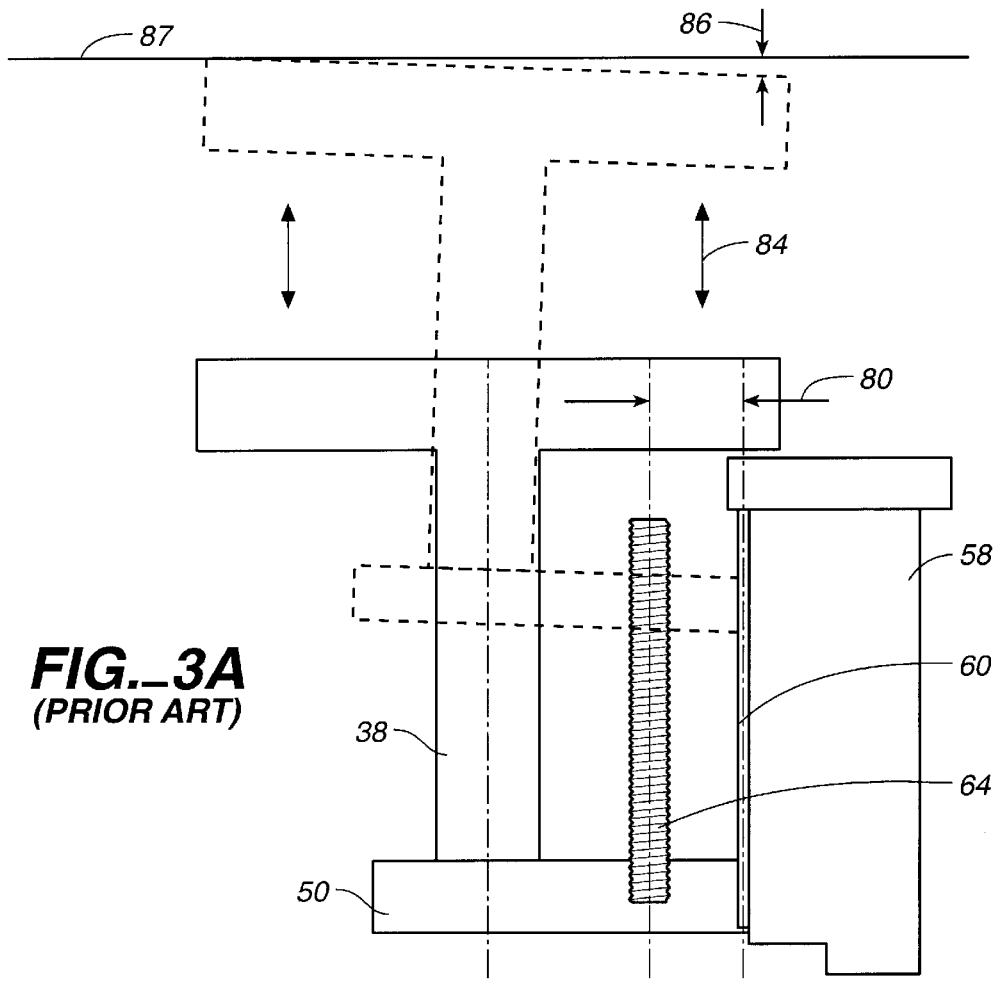
FIG._3A
(PRIOR ART)
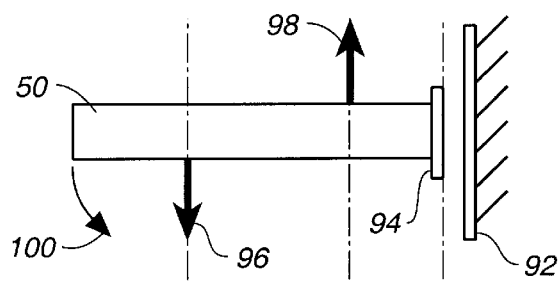
FIG._3B
(PRIOR ART)
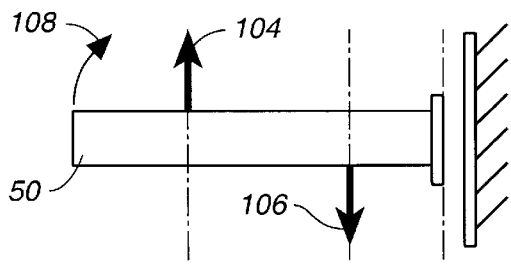
FIG._3C
(PRIOR ART)

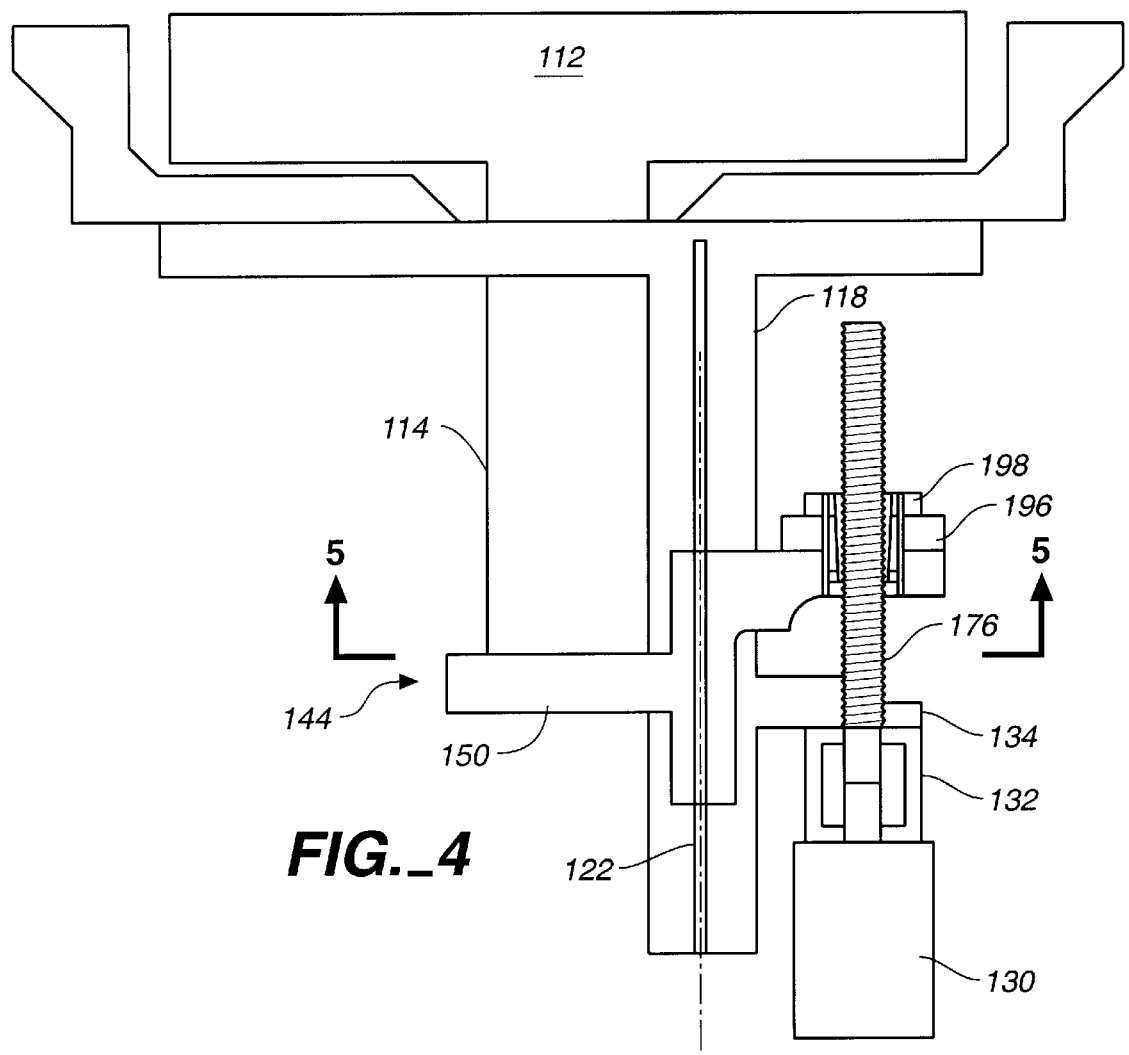
FIG._4
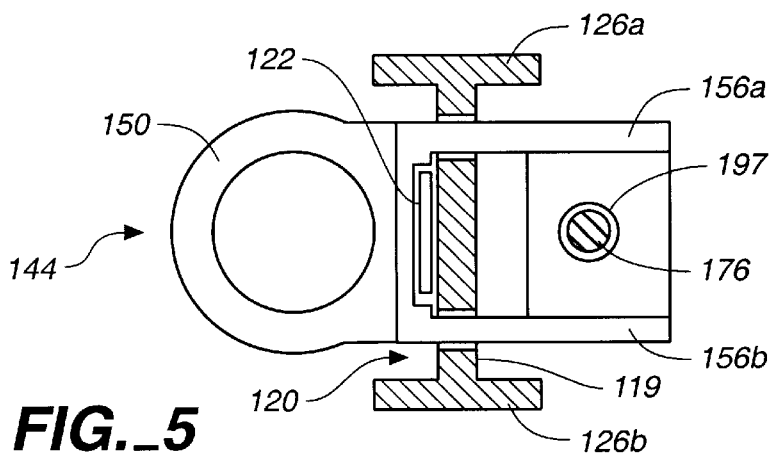
FIG._5

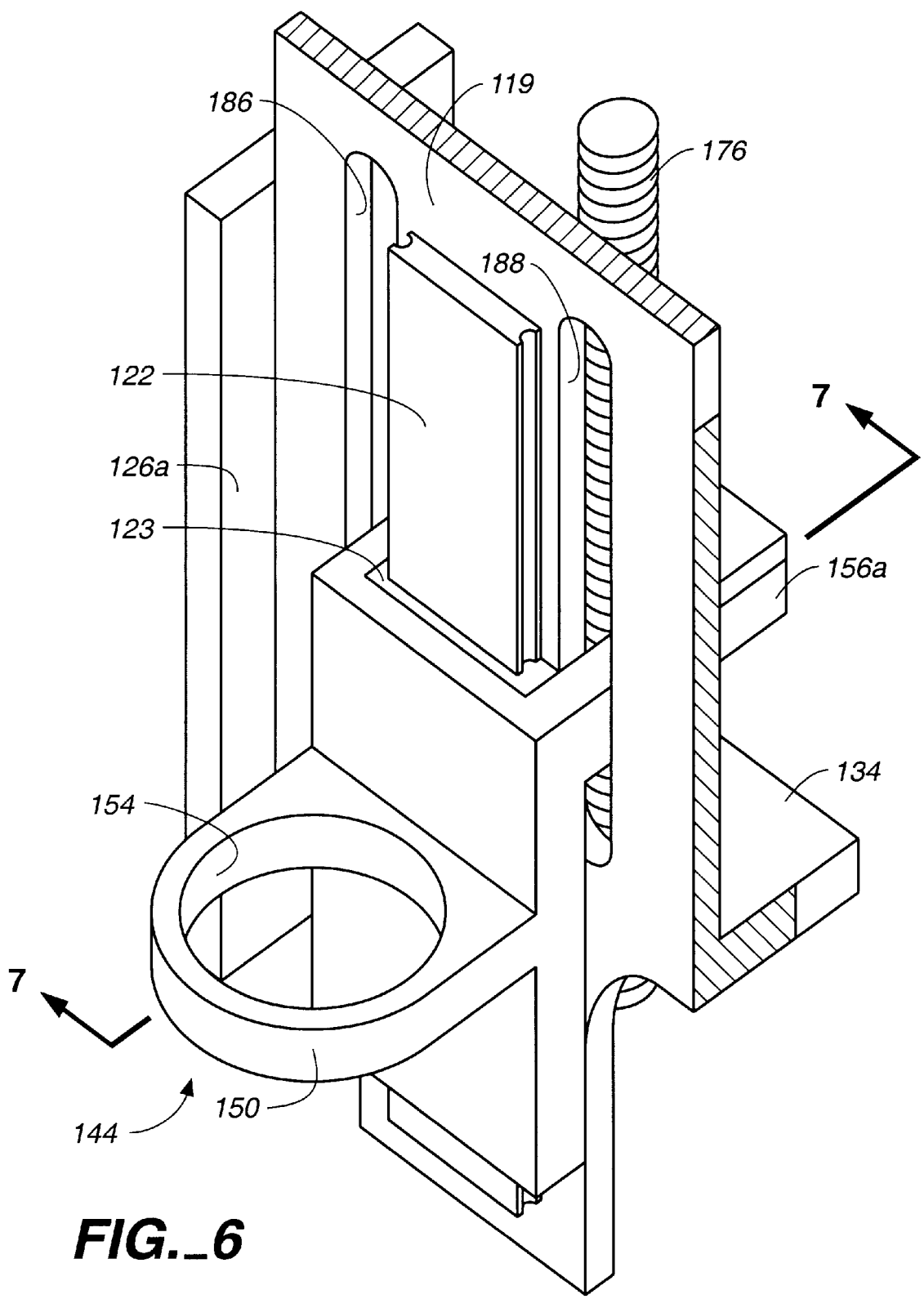
FIG._6

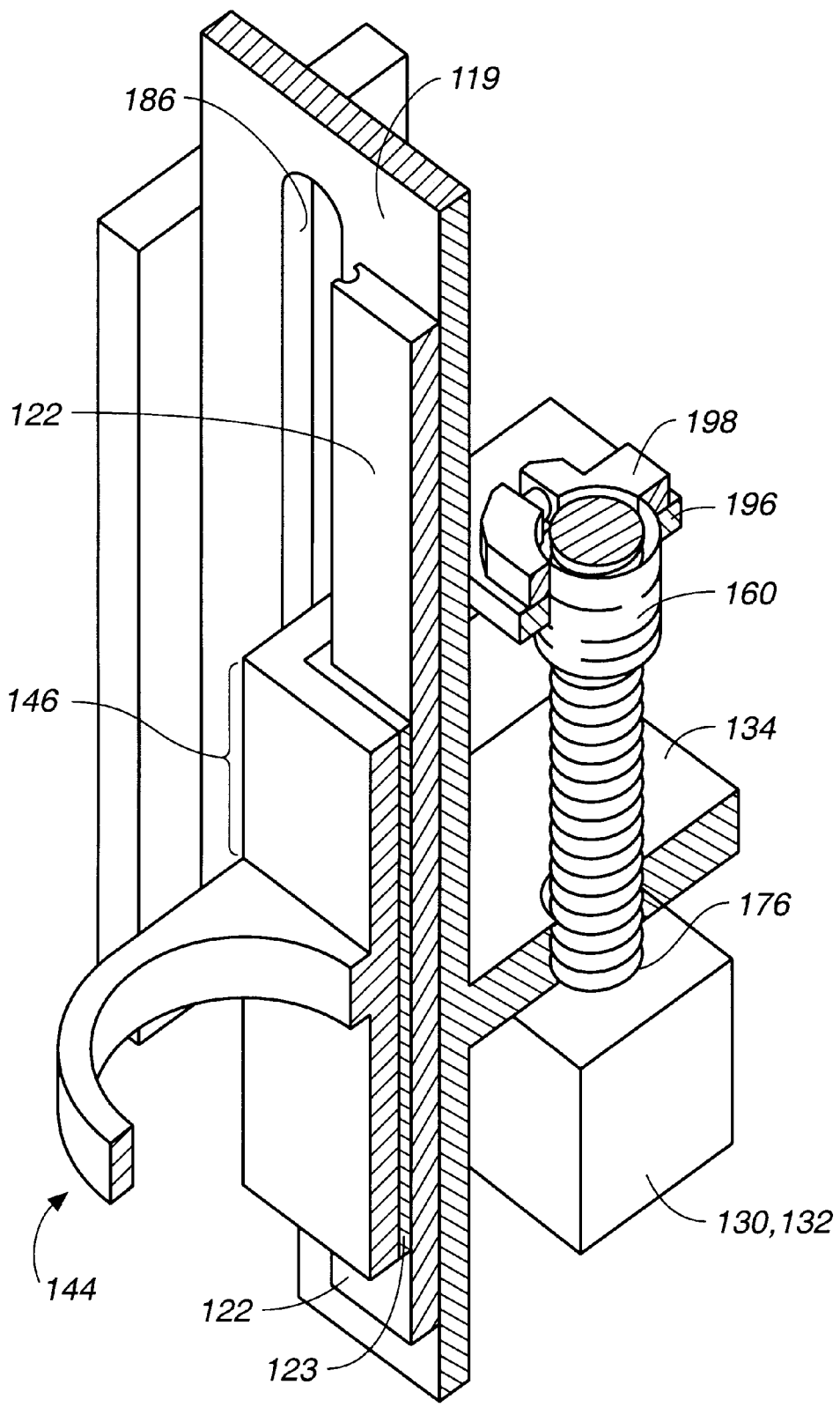
FIG._7

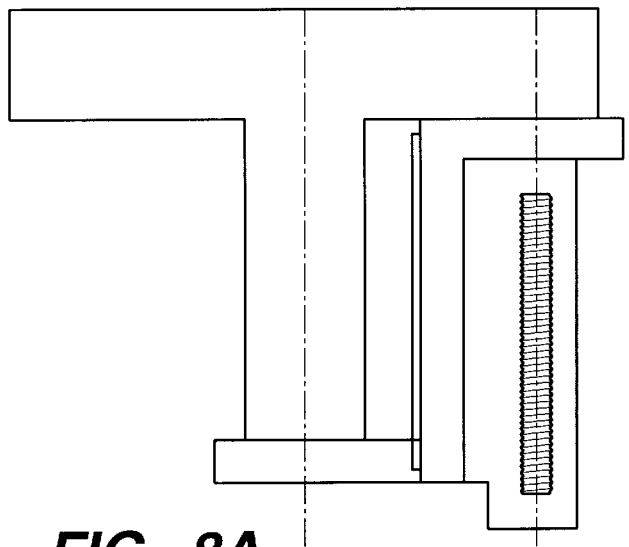
FIG._8A
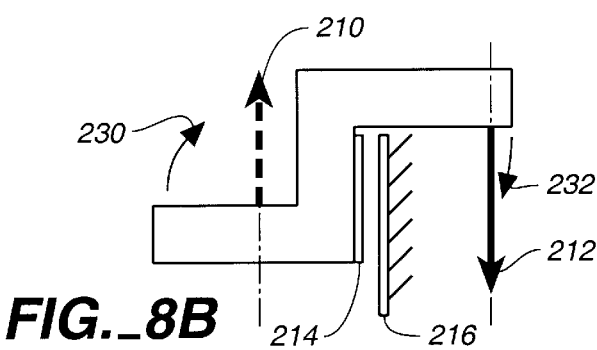
FIG._8B
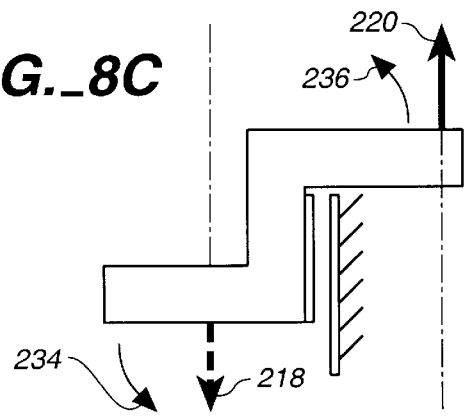
FIG._8C
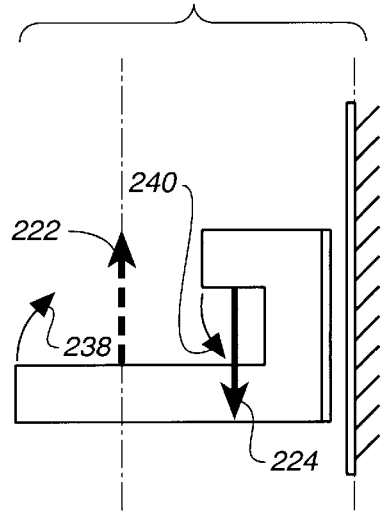
FIG._8D
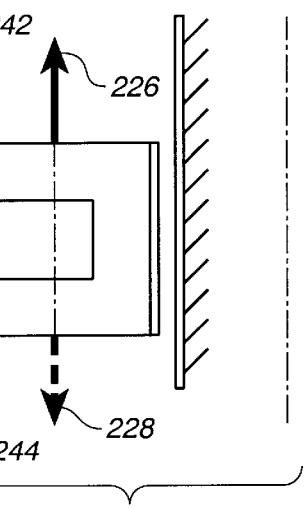
FIG._8E

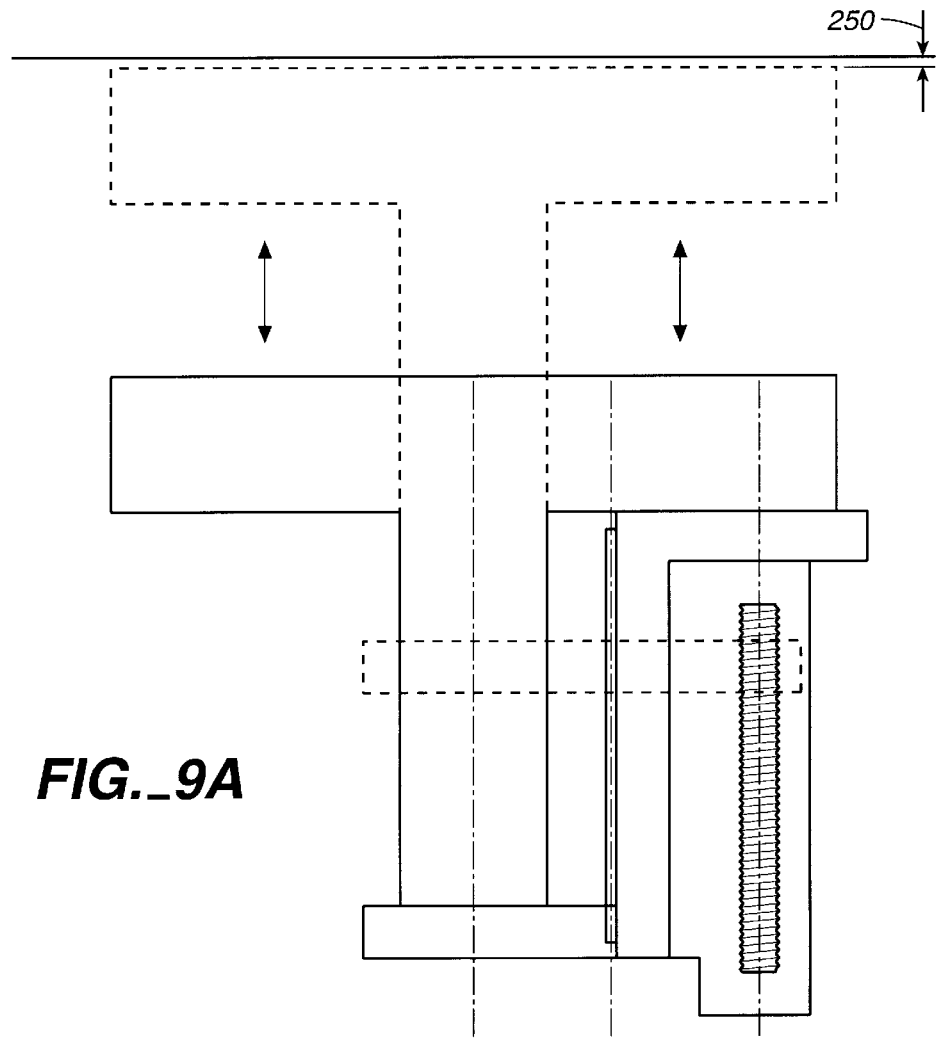
FIG._9A
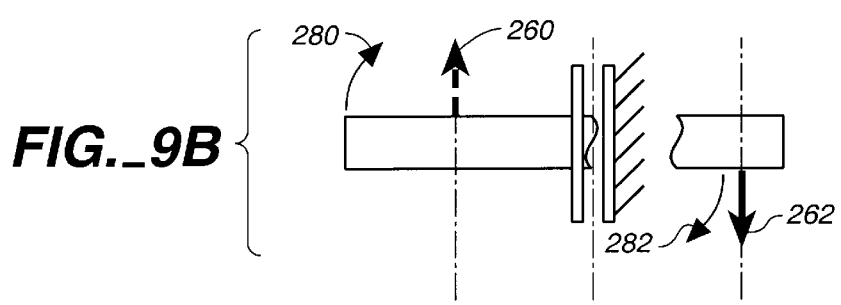
FIG._9B
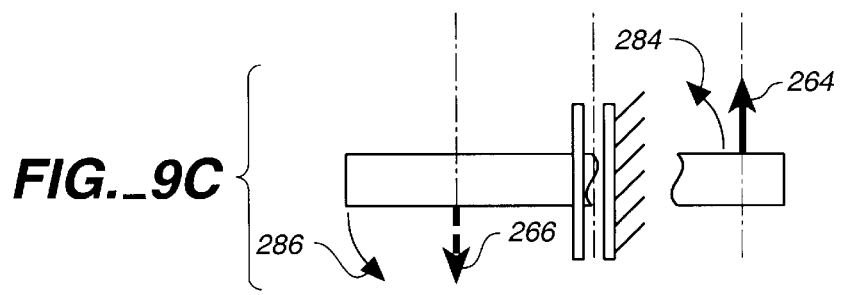
FIG._9C

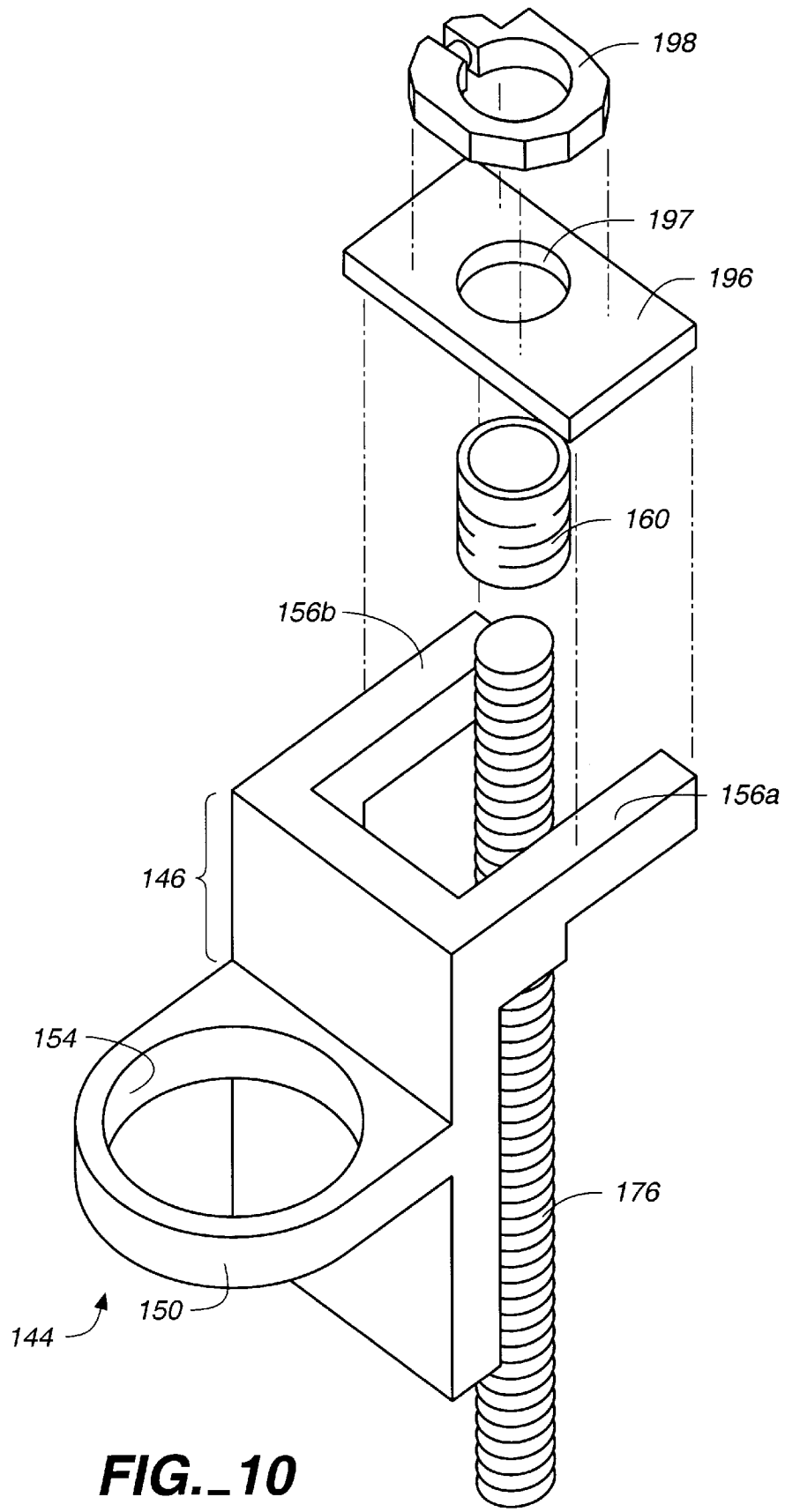
FIG._10

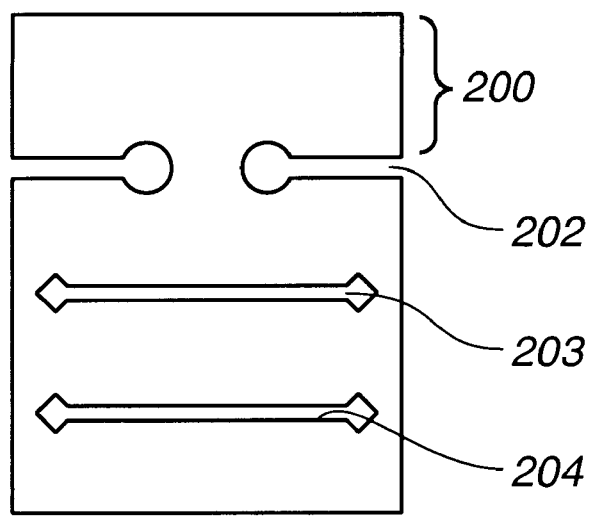
FIG._11
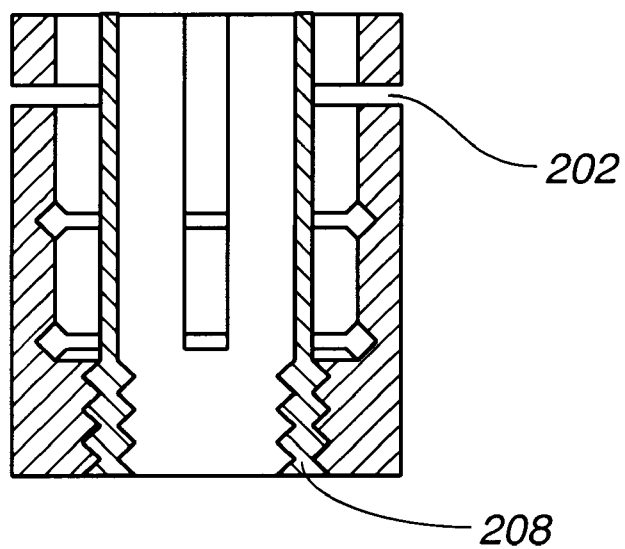
FIG._12

SELF ALIGNING LIFT MECHANISM

FIELD OF THE INVENTION

This invention relates to a structure and method of moving a substrate support member within a processing chamber. In particular the invention relates to a configuration of elements to consistently and repeatably raise and lower a wafer support pedestal supported by a stem in a processing chamber using a lifting mechanism/system outside the processing chamber.

BACKGROUND OF THE INVENTION

In substrate processing chambers such as those shown in the U.S. Patent to Zhao et al. (U.S. Pat. No. 5,558,717—CVD Processing Chamber), the movement of the substrate into and out of the chamber for processing involves several motions. One of the motions is to raise and lower the pedestal/heater with attached stem. This is the last motion before processing the wafer and the first motion after processing the wafer in the processing chamber. An example of such a lift mechanism is pictured in the U.S. Pat. No. 5,558,717 (which is expressly incorporated by reference herein). Larger and larger substrates and processing chambers are being developed used to increase the number of surface elements which are simultaneously processed on the surface of a substrate, to raise the production throughput. The use of such larger substrates and chamber elements require greater precision in the mechanical alignment and motion to maintain process uniformity.

An example of a type of mechanism 42 used in the prior art is shown in FIG. 1. A processing chamber 30 contains a substrate 32 to be processed. The substrate 32 rests on top of a pedestal/heater 36. During the transfer of the substrate 32 to and from its processing location in the processing chamber 30, lift pins 34 extend from the heater/pedestal 36 to raise the substrate 32 up from the top surface of the pedestal 36. The lift pins 34 allow a robot blade (not shown), for supporting the substrate during its transfer into and out of the chamber, to pass under the substrate supported on the extended lift pins 34 so that in a coordinated motion of raising and lowering the lift pins and insertion of the robot blade the substrate is transferred from and to a precise location on the surface of the pedestal. Once the pedestal is raised to its processing position, processing of the substrate supported on the top surface of the pedestal takes place.

Movement of the pedestal 36 is controlled by the motion of its stem 38. The stem is clamped and sealed to a stem carrier bracket 50 supporting the stem 38 and pedestal. The stem carrier bracket 50 is supported by a lift mechanism support structure/column 58 through engagement with a linear bearing track 60 and a threaded opening or nut engaged with a vertical drive screw 64 whose rotation raises or lowers the pedestal assembly. The generally vertical lifting mechanism support structure/column 58 is integral with a lift system connection plate 44 which is connected by a series of adjustment studs 46 to the bottom wall 40 of the processing chamber 30.

The angular orientation of the pedestal 36 and as a result the orientation and precise positioning of the substrate 32 in the processing chamber 30, is set and adjusted by the movement of the nuts or other adjustment members on the adjustment studs 46. A triangular arrangement of connection studs (for example see FIG. 8 of U.S. Pat. No. 5,558,717) provides one configuration for adjustment.

The stem opening in the bottom wall 40 of the processing chamber 30 is closed and sealed by a bellows assembly fixed to the bottom wall 40 of the processing chamber. The bellows assembly includes a fixed seal plate 47 connected to an upper part of an upper bellows 48a. An intermediate stem guide bracket 52 is sealed between the upper bellows 48a and the lower bellows 48b. The bottom of the lower bellows 48b is sealed to the top of the stem carrier bracket 50, which seals the end of the stem 38.

The space outside the stem 38 above the seal to the stem carrier bracket 50 is under vacuum and is sealed by the bellows assembly. The motion of the bellows 48a, 48b is guided by the intermediate guide bracket 52 which is also engaged with the linear bearing track 60. The vertical forces generated by the compression of the bellows 48a and 48b as the stem carrier bracket 50 moves causes the intermediate guide bracket 52 to move to balance the force on it.

In the arrangement shown, the stem 38 is moved in a vertical direction by moving the stem carrier bracket 50 guided by a bearing truck 62 engaging the bearing track 60 on the lift mechanism support structure/column 58. A threaded opening in the stem carrier bracket 50 engages the drive screw 64. In this configuration the drive screw 64, held by a duplex bearing 68, is rotated by a drive motor 76 through a drive pulley 72, drive belt 74, and driven pulley 70. The stem carrier bracket 50 moves the stem 38 up and or down depending on the direction of screw rotation. If the lift assembly components described were perfectly aligned to one another and made of perfectly rigid materials, such an assembly would operate consistently and easily to repeatably locate the pedestal and substrate at a particular location in the processing chamber. However, alignments are imperfect and deflections vary depending on the forces on the stem carrier bracket 50. At ambient conditions the weight of the pedestal and stem, and the force compressing the bellows tends to bend the end of the stem carrier bracket 50 down. In contrast when the processing chamber is evacuated, the atmospheric pressure outside the processing chamber tends to push the stem into the chamber rather tending to bend the stem up. Similarly the force of the drive screw 64 engaging the threaded receiving hole (or nut) on the stem carrier bracket 50 can be distorted as shown by FIGS. 3A, 3B, and 3C. In addition, binding between members because of misalignment and bending due to distortion can also occur. For the stem carrier bracket 50 to move uniformly and precisely throughout its range of travel along the bearing track 60, the forces on the stem carrier bracket 50 along the track 60 must be uniformly and consistently applied.

To avoid binding between the bearing track and the drive screw the distance 80 (shown in FIG. 3A), between the sliding axis of the bearing track 60 and the center line 66 of the drive screw 64 must be maintained.

In this configuration the duplex bearing 68 and its positioning controls the alignment of the drive screw 64. Therefore any variation in the mounting of the duplex bearing 68 within the lift mechanism support structure/column 58 will result in the misalignment between the bearing rail 60 and the centerline of the drive screw 64. Because the location of the screw receiving opening relative to the bearing truck 62 is fixed, any misalignment between the bearing track 60 and centerline 66 of the drive screw 64 will tend to cause binding between the two through the stem carriers bracket 50 as it moves along the track 60 and the drive screw 64.

In addition to binding because of misalignment, an angular misalignment between the two pieces also results. To accommodate the angular misalignment either the stem carrier bracket must bend to accommodate tightly engaged threads in the threaded rod receiving opening in the stem carrier bracket 50 or the threads (or nut) mounted therein must be loosely cut or mounted to accommodate expected angular variations due to misalignment. Sloppiness in the thread clearance can result in a free play distance as motion and forces exerted on the stem carrier bracket change directions, for example when the force between the end of the stem carrier bracket 50 supporting the stem 38 goes from a downwardly bending force as shown in FIG. 3B (which results from the normal weight of the pedestal and stem when the processing chamber is at atmospheric pressure) to an upwardly directed force 104 as shown in FIG. 3 bending the stem carrier bracket 50 upwards (when the evacuated processing chamber causes the external atmospheric force on the bellows and end of the stem to push the stein and pedestal into the processing chamber). In each instance forces tending to move the stem carrier bracket 50 are resisted by the drive screw 64 engaged with the stem carrier bracket 50. The cantilevered arm 50 in its engagement with the bearing track 60 can bind, instead of sliding, due to misalignment and slight mechanical obstructions. Any increase in the coefficient of friction which along with the resulting coupling effect of the forces shown in FIGS. 3B and 3C tends to cause a seizing rather than sliding between the stem carrier bracket 50 and the bearing truck 62. The motion of raising and lowering the pedestal, shown by arrows 84 in FIG. 3 results in the pedestal stem 38 and stem carrier bracket 50 moving in a motion between end positions as shown by the solid lines in FIG. 3A and the dashed lines showing the pedestal 38 and stem carrier bracket 50. Consider a uniform motion reference line 87 showing the horizontal attitude of a perfectly vertical lifting motion of the pedestal and pedestal stem 38, a variation (misalignment) from horizontal is shown near one edge of the pedestal by a dimension 86 which in a 10-inch diameter pedestal can be as much as 0.010–0.012 inches. The variations are not necessarily consistent, process conditions may vary and the forces causing the cantilevered stem carrier bracket to bend, bind, or otherwise change its orientation, may vary as the temperature of the support brackets and support structure change over time. Each variation creates another factor which increases the variation in the vertical orientation and reduces the likelihood of a consistent, repeatable lifting orientation and alignment.

The location of the drive screw on the same side of the slide support as the pedestal stem causes the initial force from the drive screw 64 to bend the stem carrier bracket 50. The force from the drive screw increases or decreases the stress bending the stem carrier bracket 50. Only after this initial bending is there a transfer of force to the bearing truck 62 attached to the end of the stem carrier bracket 50 to move the stem carrier bracket 50 along the bearing track 60. This arrangement causes a slight but unpredictable variation in the pedestal position depending on how much the stem carrier bracket is bent and/or how much misalignment there is between the threaded rod and the threaded opening in the stem carrier bracket 50 and the misalignment between the threaded rod and the bearing track 60.

FIGS. 3B and 3C illustrate idealized schematic views of the forces experienced by a stem carrier bracket 50 as shown in FIG. 3A. In FIG. 3B the stem carrier bracket 50 is mounted through a bearing truck 94 to a bearing rail 92 fixed to a support structure. When the process chamber is at ambient pressure the weight of the pedestal represented by the arrow 96 is opposed by the vertical force of the drive screw 64 represented by the arrow 98. The two forces represent a bending of the stem carrier bracket 50 in a direction as shown by the arrow 100. Resistance to that bending is provided by the attachment (not shown) between the bearing truck 94 and the bearing rail 92.

In contrast, the configuration of FIG. 3C shows forces when the process chamber is evacuated thereby causing the pedestal stem to be forced inward (upward) as represented by the arrow 104 and that force being resisted by the drive screw 64 whose downward forces are represented by the arrow 106. The combination of the two forces 104 and 106 will cause a bending in the stem carrier bracket 50 as shown by the arrow 108. Again the connection between the sliding bearing truck 94 and fixed bearing rail 92 resist the forces tending to rotate the stem carrier bracket 50 from its horizontal attitude.

As the sizes of substrates to be processed increase geometric variations in the process chamber dimensions need to be minimized to avoid variations in process conditions and process performance across the width of a substrate. Therefore it is desirable to minimize the variation and deviation from parallel as a pedestal and stem are lifted and provide consistency and repeatable performance based on component orientation and configurations which can be consistently predicted and repeated.

SUMMARY OF THE INVENTION

Configurations according to the invention include reducing the distance between the bearing track and the pedestal stem to reduce bending in the stem carrier bracket and using a second extension of the stem carrier bracket to engage the vertical force of the drive screw through a compliant nut attachment to eliminate binding due to misalignment between the drive screw and the bearing track. One configuration according to the invention includes a track engaging bracket (stem carrier bracket or stem carrier) having a first lateral extension arm supporting the stem of the pedestal and having a second lateral extension arm fixed to a lift mechanism, such that a force on one arm is transferred to and through a base portion of the track engaging bracket between the two arms such that only a vertical component of force is transmitted between the two arms to greatly reduce the possibility of binding between components. Bearing engagement for a long dimension of the linear track along with the offsetting of the first and second arms is provided to minimize or eliminate the possibility that a vertical force bending one arm will transfer anything other than a vertical force to the other arm. The configuration of the bracket is clever to provide a compact arrangement, to minimize the lengths from the support of lever arms and bending associated with forces on such lever arms.

In one configuration, the clever arrangement provides a symmetry around a linear bearing track. The forces on the stem carrier bracket are distributed (balanced) on two sides of a lift mechanism support plate (vertical column) by passing an arm (or a pair of arms) through a set of slots in the support plate. This configuration provides a short lever arm and simplicity in the design and also accommodates normal misalignment between adjacent pieces without detrimental binding. A self-aligning compliant nut which allows for a range of lateral movement between member capturing the nut and threaded rod on which it rides, allows for such misalignment.

Various configurations of practicing the invention are presented. They all include the principle of providing an arm to support vertical loads to the bearing track separate from the path resisting such load in second such arm. The bending displacements of such arms are thereby isolated from one another and therefore vertically consistent depending on the loads on the arms. Binding between the adjacent pieces is eliminated by minimizing the length of the cantilevered arms while maximizing the engagement distance between a bearing track and bearing truck so that binding forces are not generated.

A method according to the invention involves the steps of lifting the stem of a pedestal by supporting it by an extension arm attached to a base portion of a stem carrier bracket which is attached to a bearing track and providing a second extension arm to which a lift mechanism traveling member is attached.

A configuration according to the invention provides a substantial improvement in the consistency and attitude seen as a pedestal is moved through the range of its travel such that the deviation from flatness in a 14 inch diameter pedestal is 0.002–0.003 inches at the edge of the substrate support surface.

BRIEF DESCRIPTION OF THE DRAWINGS

FIG. 1 is a cross-sectional representation of a prior art pedestal/heater lift mechanism (substrate support member stem lift system);

FIG. 2 is a cross-section of FIG. 1 taken at 2–2;

FIG. 3A is a schematic side view of the lift mechanism configuration as shown in FIG. 1 showing variation from a horizontal plane as a pedestal is moved from a retracted position to an extended position;

FIG. 3B is a schematic diagram of the forces expected to be exerted on a stem carrier bracket when the process chamber is at ambient pressure;

FIG. 3C is a schematic diagram of the forces expected to be exerted on a stem carrier bracket when the process chamber is evacuated for processing;

FIG. 4 is a schematic cross-sectional view of a lift mechanism assembly according to the invention;

FIG. 5 is a cross-sectional bottom view of FIG. 4 cut at 5—5;

FIG. 6 is a perspective view of a lift mechanism configuration according to the invention with a side reinforcement plate removed;

FIG. 7 is a cross-section of FIG. 6 taken at 7—7 showing the relationship between the force generating and force carrying component, the threaded rod and support beam are cut short for clarity;

FIG. 8A, 8B, 8C, 8D, and 8E, shows the comparison of the force structures for various configurations of the stem carrier bracket in comparison with prior art configurations as shown in FIGS. 3B and 3C. In these configurations the first and second extension arms are offset from each other;

FIGS. 9A, 9B, and 9C, show the orientation and configuration of a carrier bracket according to the invention where the first extension arm is generally in line with the second extension arm, where the bearing track resists the transmission of the bending force from the first extension arm directly to the second extension arm;

FIG. 10 is a exploded perspective diagram of the stem lift assembly according to the invention showing the engagement of the stem carrier bracket to the drive screw;

FIG. 11 is an outside view of the compliant nut used in a configuration according to the present invention; and FIG. 12 is a cross-sectional view of FIG. 11 showing the internal construction of a compliant nut as used in configuration according to the present invention.

DETAILED DESCRIPTION

A configuration according to the invention which provides an improved alignment over prior art as discussed above is shown in FIGS. 4, 5, 6, 7, and 10. A pedestal structure 112 having an integral stem 114 is supported by a stem carrier bracket (track engaging bracket, stem support member) 144.

A perspective view of the stem carrier bracket 144 is shown in FIG. 10. It includes a first lateral extension arm (lateral stem support bracket) 150 which engages and supports the stem 114 as shown in FIG. 4. The first lateral extension arm 150 is integral with a base portion 146 which runs along the vertical bearing rail truck 123 which engages the vertical bearing rail track 122. The vertical base portion 146 may have a short length or may extend the full vertical length of the stem carrier bracket 144, but will generally coincide with the length of the vertical bearing rail truck 123 which resists the lateral forces from the truck 123 to the track 122. The vertical track provides a vertical sliding motion, for example through a linear rail recirculating ball connection. The stem carrier bracket 144 includes a set of two second lateral extension arms (arm members) 156a, 156b.

The first lateral extension arm 150 is configured to support the pedestal stem 114, for example through engagement with the hole 154. The inside (side opposite the first lateral extension arm) of the base portion 146 of the stem carrier bracket 144 is fixed to the vertical bearing rail truck 123 which engages the vertical bearing rail track 122 attached to a vertical plate 119 between two slots 186 and 188, which pass the two lateral arms 156a, 156b which in this configuration constitute the second lateral extension arm. To increase the stiffness of the vertical plate 119 of the stem track support member/column 118, the vertical plate includes a set of side reinforcing plates 126a, 126b to minimize the deflection due to bending forces.

The vertical support plate 119 is connected to a motor support plate 134 supporting a lift drive motor 130 and a coupling housing 132. A duplex thrust bearing (not shown) establishes vertical orientation for the drive mechanism traveler track (drive screw) 176.

The drive screw 176 extends vertically between the arms 156a, 156b of the stem carrier bracket 150. An arm spanning plate 196 is fixed to the arms 156a and 156b (by screws not shown) such that a hole 197 in the arm spanning plate 196 freely passes the threaded rod 176 and its lift mechanism traveling member (compliant nut) 160. A nut clamp 198 is fixed to a top section 200 of the compliant nut 160 and then is fixed to the arm spanning plate shown in FIGS. 7 and 10.

The compliant nut 160 and drive screw 176 are such that lateral slots, for example 202, 203, and 204, in the various orientations in the side of the nut housing allow for precise motion nearly without backlash and freeplay while accommodating misalignment between the nut holding member and the threaded rod. To use a compliant nut as described above alignment to within 0.002 inches is recommended when using a precision lead screw assembly as manufactured by Universal Thread Grinding, Company which provides self-adjusting nut and thrust bushing, for example as described in U.S. Pat. Nos. 3,977,269; 3,831,460; and 4,434,677. The internals of the nut accommodate slight misalignments while providing a very precise thread engagement for axial movement substantially without backlash to maintain position of the mechanism (nut) in a desired orientation. The threads of the nut 160 engage the threaded rod 176 at a first bottom end 208 as shown in FIG. 12. Then the slots in the 202, 203, 204 in the side of the nut housing allow the various sections of the housing to bend relative to one another to accommodate a variation in the alignment between the two as the top end section 200 of the compliant nut 160 is clamped tight to the stem carrier member 144. When using a configuration like this there is no sideways binding between the adjacent members which would in some ways affect the positioning of the carrier bracket 144 nor the positioning of the pedestal in the processing chamber. In this configuration, when using a precision lead screw assembly, the virtual elimination of the backlash in the screw/nut connection, eliminates one factor in the prior art arrangement which contributes to the misalignment and non-parallelism and non-repeatability of the motion of the pedestal stem and pedestal substrate face.

FIGS. 8A, 8B, and 8C, show a relationship of schematic force diagrams to the configuration of the forces applied to a stem carrier bracket in a configuration according to the invention. As shown in FIG. 8B, a vertical force 210 due to the vacuum in the processing chamber is opposed by a downward force 212 as a result of the engagement of the lead screw and its nut. While as in prior art the two forces; tend to cause the bending, as shown by the two arrows 230 and 232 of the two extension arms, such bending is isolated to the individual arms. The fixed lateral engagement between the bearing truck 214 and the bearing track 216 eliminates the transmission of bending stress or displacement from one arm to the other.

A similar configuration is shown in FIG. 8C where the force 218 represents the weight of the pedestal and the stem and force 220 is the lifting or raising force opposing the descent of the pedestal and stem such that bending of the arm elements as pictured by arrows 234 and 236 take place. Again the stress and displacement associated with bending in one arm is isolated from the stress and displacement associated with bending in the other arm, by the engagement of the linear track. The linear track prevents anything other than a vertical force from being transmitted.

FIGS. 8D and 8E provide the two alternate orientations of the invention where the two separate arms attached to the stem carrier bracket extend in the same direction from the linear bracket. In these instances the forces in bending of the arm elements are again isolated from one another. In FIG. 8D, the vertical force is opposed by the vertical force 224 while bending of the arms, as shown by the arrows 238 and 240, is isolated by the engagement with the bearing track. In FIG. 8E, the vertical force 226 is opposed by the vertical force 228 and any bending of elements associated with the forces such as shown by the arrows 242 and 244 are isolated from each other through the bearing truck/track interface.

The configuration of the invention as shown in FIGS. 9A, 9B, and 9C, provides a configuration where vertical forces and bending forces are substantially isolated from one another in arms of a co-linear plate rather than an offset plate as discussed above. The bearing truck/track engagement tends to isolate the bending of one side from the other.

In FIG. 9A a relatively small (0.002–0.003 inches at the edge of the substrate support surface) out of parallel offset distance 250 in the extension and retraction motion of the pedestal when utilizing this invention (whether the two arms are offset or are in-line) is shown.

In FIG. 9B the vertical force 260 is opposed by the vertical force 262 while the bending shown by the arrows 280 and 282 is opposed by the engagement with the truck and track bearings.

In FIG. 9C the vertical force 266 is opposed by the vertical force 264 and the bending as shown by the arrows 284 and 286 is opposed by the truck/track engagement as shown therein.

A method according to the invention includes the steps of isolating the load from the force moving the load through a bearing track such that the orientation of a substrate supported as part of the load in the processing chamber is substantially unchanged.

While the invention has been described with regards to specific embodiments, those skilled in the art will recognize that changes can be made in form and detail without departing from the spirit and scope of the invention.

We claim:

1. A substrate support member stem lift system comprising:
    a stem carrier bracket having
        a first arm supporting a stem of a substrate support member,
        a second arm fixed to a traveling member of a stem lift mechanism;
        a base portion supporting said first arm and said second arm, wherein said base portion is engaged with a bearing track of a support member, where said first arm and said second arm extend in a direction lateral from said bearing track, wherein said first arm is distinct from said second arm; and
    a bearing track support member supporting said bearing track.

2. The substrate support member stem lift system as in claim 1,
    wherein said first arm is generally aligned with said second arm.

3. The substrate support member stem lift system as in claim 2,
    wherein said first arm extends in a first direction and said second arm extends in a second direction where said first direction and said second direction are approximately the same.

4. The substrate support member stem lift system as in claim 2,
    wherein said first arm extends in a first direction and said second arm extends in a second direction where said first direction and said second direction are distinct from one another.

5. The substrate support member stem lift system as in claim 4,
    wherein as said second arm extends from said base portion to said traveling member it extends through an opening in said bearing track support member.

6. The substrate support member stem lift system as in claim 5,
    wherein as said second arm has two arm portions each of which as they extend from said base portion to said traveling member each extend through that arm portion's own opening in said bearing track support member.

7. The substrate support member stem lift system as in claim 2.
    wherein as said second arm extends from said base portion to said traveling member it extends through an opening in said bearing track support member.

8. The substrate support member stem lift system as in claim 7,
    wherein as said second arm has two arm portions each of which as they extend from said base portion to said traveling member each extend through that arm portion's own opening in said bearing track support member.

9. The substrate support member stem lift system as in claim 2, wherein the connection to fix said second arm to the traveling member of said stem lift mechanism has negligible resistance to differential lateral movement between the bearing track and the path of the traveling member of the lift mechanism as the traveling member moves in direction along said track.

10. The substrate support member stem lift system as in claim 9, wherein the connection to fix said second arm to the traveling, member of said stem lift mechanism is a compliant nut.

11. The substrate support member stem lift system as in claim 1, wherein said first arm is offset from said second arm.

12. The substrate support member stem lift system as in claim 11, wherein said first arm extends in a first direction and said second arm extends in a second direction where said first direction and said second direction are approximately the same.

13. The substrate support member stem lift system as in claim 11, wherein said first arm extends in a first direction and said second arm extends in a second direction where said first direction and said second direction are distinct from one another.

14. The substrate support member stem lift system as in claim 13, wherein as said second arm extends from said base portion to said traveling member it extends through an opening in said bearing track support member.

15. The substrate support member stem lift system as in claim 14, wherein as said second arm has two arm portions each of which as they extend from said base portion to said traveling member each extend through that arm portion's own opening in said bearing track support member.

16. The substrate support member stem lift system as in claim 15, wherein the connection to fix said second arm to the traveling member of said stem lift mechanism has negligible resistance to differential lateral movement between the bearing track and the path of the traveling member of the lift mechanism as the traveling member moves in direction along said track.

17. The substrate support member stem lift system as in claim 16, wherein the connection to fix said second arm to the traveling member of said stem lift mechanism is a compliant nut.

18. The substrate support member stem lift system as in claim 11, wherein as said second arm extends from said base portion to said traveling member it extends through an opening in said bearing track support member.

19. The substrate support member stem lift system as in claim 18, wherein as said second arm has two arm portions each of which as they extend from said base portion to said traveling member each extend through that arm portion's own opening in said bearing track support member.

20. The substrate support member stem lift system as in claim 18, wherein the connection to fix said second arm to the traveling member of said stem lift mechanism has negligible resistance to differential lateral movement between the bearing track and the path of the traveling member of the lift mechanism as the traveling member moves in direction along said track.

21. The substrate support member stem lift system as in claim 20, wherein the connection to fix said second arm to the traveling member of said stem lift mechanism is a compliant nut.

22. The substrate support member stem lift system as in claim 1, wherein as said second arm extends from said base portion to said traveling member it extends through an opening in said bearing track support member.

23. The substrate support member stem lift system as in claim 22, wherein as said second arm has two arm portions each of which as they extend from said base portion to said traveling member each extend through that arm portion's own opening in said bearing track support member.

24. The substrate support member stem lift system as in claim 1, wherein the connection to fix said second arm to the traveling member of said stem lift mechanism has negligible resistance to differential lateral movement between the bearing track and the path of the traveling member of the lift mechanism as the traveling member moves in a direction along said track.

25. The substrate support member stem lift system as in claim 24, wherein the connection to fix said second arm to the traveling member of said stem lift mechanism is a compliant nut.

26. The substrate support member stem lift system as in claim 1, wherein the path of said stem is directly adjacent to said bearing track as said stem is moved by said stem carrier bracket.

27. A substrate support member stem lift system comprising:

a stem guide track located adjacent to a stem to be lifted, the track being fixed to a stem support member;

a track engaging bracket having a base portion engaged with said stem guide track to slide along said track following a path along a longitudinal axis of said track and to substantially prevent the track engaging bracket from moving in a direction approximately perpendicular to said longitudinal axis of said track, wherein said track engaging bracket includes a first lateral extension arm at a first position extending in a lateral direction from said longitudinal axis of said track, wherein said first lateral extension arm is configured to be fixed to the support member stem so that the substrate support member stem moves simultaneously with the first lateral extension arm, wherein said track engaging bracket includes a second lateral extension arm, separate from said first lateral extension arm, at a second position extending in a lateral direction from said longitudinal axis of said track, wherein said second lateral extension arm is fixed to a lift mechanism traveling member so that the second lateral extension arm moves simultaneously with the lift mechanism traveling member, wherein the components of a stem force from said support member stem through said first lateral extension arm in a direction other than along said longitudinal axis of said track are resisted by the engagement between said base portion of said track engaging bracket and said stem guide track, wherein the components of a lift force from said lift mechanism traveling member through said second lateral extension arm in a direction other than along; said longitudinal axis of said track are resisted by the engagement between said base portion of said track engaging bracket and said stem guide track, wherein a component of said stem force along said longitudinal axis of said track is applied to said base portion through said first lateral extension arm and at rest is opposed by a component of said lift force along said longitudinal axis of said track applied to said base through said second extension arm.

28. The substrate support member lift system as in claim 27, wherein said first lateral extension arm is offset from said second lateral extension arm.

29. The substrate support member lift system as in claim 27, wherein said first lateral extension arm extends in a first direction while said second lateral extension portion extends in a second direction approximately opposite to said first direction.

30. The substrate support member lift system as in claim 29, wherein said first lateral extension arm is offset from said second lateral extension arm.

31. The substrate support member lift system as in claim 29, wherein as said second arm extends from said base portion to said traveling member it extends through an opening in said bearing track support member.

32. The substrate support member lift system as in claim 29, wherein the connection to fix said second arm to the traveling member of said stem lift mechanism has negligible resistance to differential lateral movement between the bearing track and the path of the traveling member of the lift mechanism as the traveling member moves in a direction along said track.

33. A method of lifting a pedestal comprising the steps of:

supporting a stem through a first extension arm;

connecting said first extension arm to a first position of a base portion of a stem carrier bracket, wherein the stem carrier bracket is attached to a bearing track;

providing a second extension arm connected to a second position of said base portion; wherein a lift mechanism traveling member is attached to said second extension arm; and lifting said lift mechanism traveling member.

34. A method of lifting a pedestal comprising the steps of:

fixing the pedestal load to a first arm;

fixing the lifting load to a second arm connected to said first arm;

lifting said pedestal by changing said lifting load; and substantially isolating the component of the pedestal load not along a bearing track from component of lifting load not along said bearing track by providing a bearing track to support said arms bearing track such that the orientation of substrate in the processing chamber is substantially unchanged as the arms move along the bearing track.

* * * * *